Nov. 30, 1954

J. W. GRAY 2,695,988

MIXER-MODULATOR

Filed Oct. 30, 1953

INVENTOR.
JOHN W. GRAY

BY A. A. Maury

ATTORNEY

United States Patent Office 2,695,988

Patented Nov. 30, 1954

2,695,988

MIXER-MODULATOR

John W. Gray, Pleasantville, N. Y., assignor to General Precision Laboratory Incorporated, a corporation of New York Application October 30, 1953, Serial No. 389,213

5 Claims. (Cl. 332—44)

This invention pertains to mixer-modulators for combining two electrical qualities to produce an output quality. More specifically, this invention pertains to apparatus for amplitude modulation to produce an output electrical quality having frequencies which are the sum and the difference of two input frequencies, these input frequencies themselves being suppressed in the output.

The process of modulation is necessarily preceded or accompanied by the introduction or intermingling of two or more electrical qualities in a single electrical circuit, followed or accompanied by a synthesis therefrom of a single electrical quality by an operation which mathematically is multiplication, producing output signals having frequencies equal to the sum and difference of the input signal frequencies, as well as higher frequencies. Often the output energy contains, in addition to all of these frequencies, one or both of the input frequencies.

In any signal modulator the input signal frequencies can be eliminated from the output by filtering. In some modulators the input signal frequencies are inherently eliminated to some degree, but in any case these devices either eliminate the input signal frequencies imperfectly, or require very exact balancing, or employ complicated circuits.

The instant invention provides a simple mixer-modulator which inherently eliminates both input signal frequencies from the output without the use of filters, and accomplishes this result simply and completely. The invention attains this result by employing four diodes in conjunction with a square wave carrier input in such fashion that the diodes behave merely as switches, and variations in their characteristic curves of voltage versus current have no effect upon the behavior of the circuit. As one result, the elimination of input signal frequencies is so superior to that of other devices heretofore used as to constitute a qualitative improvement. If a filter is desired to select the difference modulation frequency as is frequently the case, such filter need be only of the simple low-pass type.

The principal purpose of this invention is to provide a simple circuit for mixing and modulating two signal frequencies, the circuit producing an output from which both input signal frequencies are excluded.

A more specific purpose is to provide an electronic circuit for modulating a rectangular wave carrier voltage by another alternating voltage to produce an output voltage from which all input frequencies are excluded.

A still more specific purpose is to provide a simple electronic circuit for amplitude modulation at any signal frequency, the carrier voltage having a rectangular wave shape and all input frequencies being inherently excluded from the output without the use of filters.

Another purpose is to provide a circuit for amplitude modulation with complete elimination of the input signal frequencies from the output and with exact reproduction of the modulating envelope in the output, the circuit being simple and easily and accurately balanced.

In general these purposes are accomplished by impressing the modulating signal across a balanced impedance the midterminal of which is connected to one side of the output while the other side of the output is alternately connected to the opposite terminals of the impedance in timed relation with the alternations of the carrier frequency signal.

A further understanding of this invention may be secured from the detailed description together with the accompanying drawings, in which.

Figure 1:
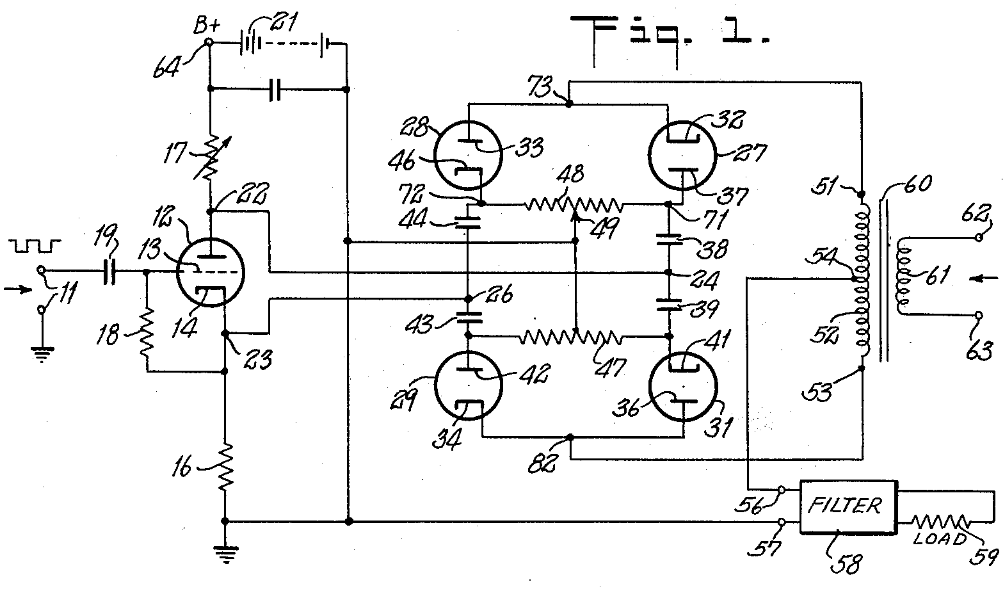
Figure 1 is a schematic illustration of one form of the invention.

Referring now to Fig. 1, an alternating voltage carrier signal having a generally rectangular wave form is supplied to input terminals 11 from any suitable source such as a multivibrator or commutator. The frequency of this carrier signal may have any desired value, the several circuit components being so chosen as to be appropriate for the selected frequency. Although the form of this voltage signal is preferably rectangular, the sides of the wave form may be somewhat sloping or curved, as, for example, a flat-topped sinusoidal wave. However, it is important that successive half cycles be symmetrical, therefore, although the signal can be derived as a push-pull input signal from the two output terminals of a multivibrator, it is preferable to employ single-ended input and a phase inverter.

Accordingly, in the example of the invention here illustrated, the input terminals 11 are connected to a paraphase amplifier triode 12, so that the control grid 13 thereof is excited relative to the cathode 14 by the input signal. The cathode and anode resistors 16 and 17 are made equal, the latter being adjustable for precision in this respect. The resistances of these resistors should be low in relation to other circuit impedances. For instance, a suitable resistance for the cathode resistor 16 is 6,800 ohms and a suitable maximum resistance for the anode rheostat 17 is 10,000 ohms, so that it can be adjusted for impedance effectively equal to 6,800 ohms. A grid leak resistor 18 and a coupling condenser 19 are connected to the grid. The anode resistor 17 is connected to a suitable source of positive potential diagrammatically illustrated as a battery 21 so that two rectangular output voltages of opposite phase are secured from the anode and cathode output terminals 22 and 23 each of which has an adequate peak-to-peak magnitude for proper operation of the circuit associated therewith.

The paraphase amplifier output terminals 22 and 23 are connected to the respective input terminals 24 and 26 of a rectifier bridge consisting of four diodes 27, 28, 29 and 31. This rectifier bridge is formed by connecting the cathode 32 of diode 27 directly to the anode 33 of diode 28, and the cathode 34 of diode 29 directly to the anode 36 of diode 31. At the same time the anode 37 of diode 27 is connected through two relatively large and equal series condensers 38 and 39 to the cathode 41 of diode 31, and the anode 42 of diode 29 is connected through two condensers 43 and 44 to the cathode 46 of diode 28, the condensers 38, 39, 43 and 44 being equal in size. The cathode 41 and anode 42 are provided with equal impedance paths as respects ground by connecting them together through a center-tapped resistor 47 the midpoint of which is grounded. Similarly, the anode 37 and cathode 46 are interconnected by a voltage divider 48 the movable contact 49 of which is grounded, this adjustment being provided so that the bridge may be balanced with respect to ground. The resistor 47 and voltage divider 48 may each have an impedance of approximately 45,000 ohms.

Crystal diodes, dry rectifiers such as copper oxide elements, or any other unidirectional conductors may be employed in place of the diodes 27, 28, 29 and 31. In any case, however, the rectifying elements which go to make up the arms of the bridge are constituted by linear rectifiers rather than square law or other exponential rectifiers.

The common junction 73 of cathode 32 and anode 33 is connected to one terminal 51 of a center-tapped inductance coil 52, and the common junction 82 of cathode 34 and anode 36 is connected to the other terminal 53 of the same coil 52. The center tap 54 of the coil 52 is connected to one output terminal 56, the other output terminal 57 being grounded. The output terminals 56 and 57 are connected through a low-pass filter 58 to an output or utilization load 59, here illustrated as a simple resistor for the sake of simplicity. The impedance of the output load 59 as well as the impedances of the two halves of the coil 52 should be relatively high compared to the impedances of the resistors 16 and 17, 47 and 48, in order to preserve reasonable efficiency. For instance, a reasonable value for the load impedance is 470,000 ohms.

The coil 52 constitutes the secondary winding of a transformer 60 the primary winding 61 of which is inductively associated in a symmetrical manner with the secondary winding 52 so that the magnetic energization of the secondary winding is equal in its two halves. The modulating voltage signals are applied to the terminals 62 and 63 of the primary winding 61 and are thus electromagnetically introduced to the secondary winding 52.

The modulating signal applied to terminals 62 and 63 may be of any frequency or combination of frequencies, or it may have an acyclic envelope. If it consists of one or more cyclic voltages, their frequencies may bear any desired ratio to the carrier frequency, and the modulating voltage may have any desired bandwidth.

The transformer 60 including the inductively related windings 52 and 61 must, of course, be suitable for the frequency magnitude and bandwidth which it is required to pass. Since, however, as stated the load 59 has high impedance so that the secondary winding current is negligible, it is only necessary that the primary winding 61 and the magnitude structure of the transformer are suitable for all frequencies of the modulating signal and that the secondary winding 52 in its non-current condition is not resonant, that is, is flat at those frequencies.

In operation, the square wave carrier potential applied at terminals 11 swings the control grid 13 by several volts relative to ground, so that the tube 12 alternates between the conductive condition, at which time the potentials of the output terminals 22 and 23 are substantially the same, and the non-conductive condition when the potential of the terminal 22 is nearly that of the +B terminal 64 and the potential of the terminal 23 is nearly that of ground. Thus at each output terminal, 22 and 23, there is a square wave potential having a peak-to-peak magnitude of say 50 volts and of opposite phase with respect to each other. These potentials are applied through the junctions 24 and 26 and the condensers 38, 39, 43 and 44 to the four diodes. Since these potentials are applied through condensers, the diode reference potentials are not related to the reference potentials of the terminals 22 and 23, but are controlled by the ground connections to the resistor 47 and the voltage divider 48.

Figure 2A:
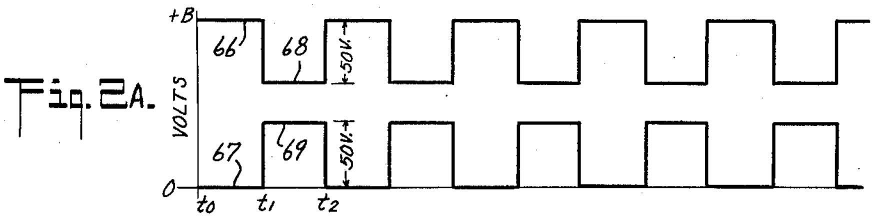
Figures 2A, 2B and 2C are graphic illustrations utilized in explaining the operation of the invention.
Figure 2B:
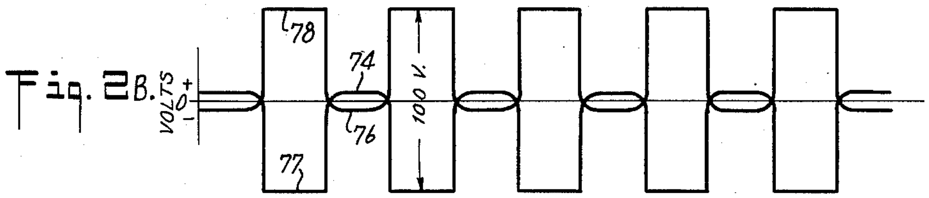
Figure 2C:
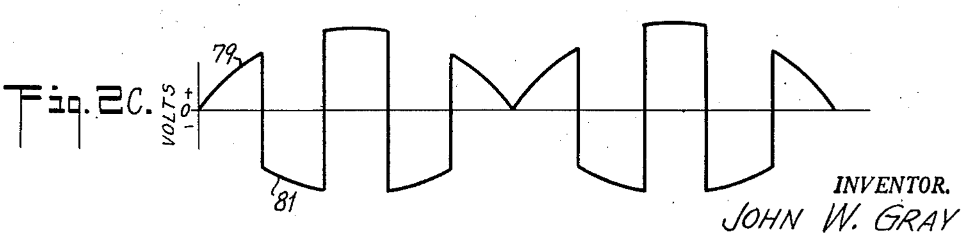

This relationship is more clearly shown in Figs. 2A 2B and 2C. In Fig. 2A the voltage 66 is that of the junction 22, Fig. 1, when the grid 13 is most negative and the triode 12 is least conductive, whilst the voltage 67 is that of the junction 23. When the control grid 13 is made most positive the junction 22 is reduced by, say, 50 volts to the level 68, Fig. 2A. This large negative step causes the diode 27, Fig. 1, to become completely non-conductive. At the same time the voltage of junction 23 increases by 50 volts, as illustrated at 69, Fig. 2A, making the cathode 46 of diode 28 highly positive and causing that diode to become completely non-conductive. The condensers 38 and 44 are relatively very large so that the impressed 100-volt potential difference of the junctions 24 and 26 is impressed across the voltage divider 48 and since the time constant is large approximately two milliamperes of constant current flow during the entire half cycle. This current multiplied by the time period measures the quantity of electric charge transferred thus from condenser 44 to condenser 38 through the voltage divider 48.

At time $t_2$, Fig. 2A, the voltage of junction 22 again rises by 50 volts, causing the diode 27 to become conductive and similarly the fall of voltage of the junction 23 causes diode 28 to become conductive. The internal resistances of these diodes immediately falls to a few hundred ohms and the voltage drop through each is only a fraction of a volt, so that during this half cycle in which the charge in condenser 38 returns to condenser 44, principally through the diodes, 27 and 28, the potential of junction 71 is on the average about ½ volt above ground, that of junction 72 is about ½ volt below ground, and that of junction 73 is very closely that of ground.

This is illustrated in Fig. 2B, in which the potential 74 represents that of the anode 37 at this time and the potential 76 represents that of the cathode 46, with the average of these two potentials that of ground. The potentials 77 and 78 represent respectively the potentials of the terminals 71 and 72 during the period $t_1$–$t_2$ of diode non-conductance. During this period obviously the cathode 32 can be charged negatively to as low as −50 volts without disturbing the relationship, and the anode 33 can be charged positively by as much as +50 volts. That is to say, the junction 73 and 82 can vary by as much as 50 volts each in opposite directions.

Similar reasoning is applied to the conjugate circuit comprising the diodes 29 and 31. It is therefore obvious that when the transformer terminal 51 is clamped to ground by rendering diodes 27 and 28 conductive, the opposite terminal 53 has a freedom of movement with respect of ground of ±50 volts, and conversely, when the terminal 53 is clamped to ground by rendering diodes 29 and 31 conductive, the terminal 51 may similarly vary in potential by ±50 volts.

Let it be considered for purposes of explanation that the modulation voltage applied to terminals 62 and 63 is a simple sinusoid of exactly one-fifth of the carrier frequency applied to terminal 11, and that at time zero both inputs are zero and in phase. Between time $t_0$ and time $t_1$ the tube 12 is non-conductive, the diodes 27 and 28 are conductive, and junction 73 and terminal 51 are at ground potential. During the same period the diodes 29 and 31 are non-conductive and the junction 82 and terminal 53 "float" or are unconnected. During this period the input potential across terminals 62 and 63 rises sinusoidally with such polarity as to increase the potential of the midtap 54 with relation to the terminal 51, so that the voltage change of the output terminal 56 with relation to the grounded terminal is positive and is represented in Fig. 2C at 79.

During the next half cycle, between times $t_1$ and $t_2$, the ground is transferred to the transformer terminal 53 and terminal 51 is effectively opened. However, as the modulating input is still rising, the potential of midtap 54 continues to increase relative to terminal 51, and also the potential of terminal 53 increases relative to the midtap 54. But terminal 53 being grounded, this action is manifested by a decrease of voltage at midtap 54 relative to the grounded terminal 53. This is illustrated in Fig. 2C at 81.

Thus the complete curve of Fig. 2C represents the output voltage with respect to ground of the output terminal 56. It can be shown to contain sum and difference modulation products and higher modulation product frequencies, but does not ideally contain any of the input signal frequencies, the circuit being ideal if the symmetry and form of the carrier signal are perfect, if diodes are linear and if the several impedances in the bridges are accurately balanced. It is apparent in Fig. 2C that the carrier frequency in the output voltage wave reverses its phase every half modulating period, so that on the average the carrier frequency cancels out. Also, it is obvious that at zero carrier voltage the output will contain no modulating voltage and therefore will be zero, as the midterminal 54 is symmetrical between the transformer secondary and terminals.

Inspection of Fig. 1 reveals two bridge circuits. The four-arm bridge circuit containing the four diodes as arm elements is one of these. It is energized at two opposite terminals 24 and 26 and the output is taken from the remaining two terminals 73 and 82. Therefore, for alternating current or pulses the frequency of the voltage applied to the terminals 24 and 26 does not appear at the terminals 73 and 82.

The other bridge consists of the two halves of the coil 52 as two of the arms, the two diodes 27 and 28 in parallel together with their associated paths to ground as the third arm, and the two diodes 29 and 31 with their associated paths to ground as the fourth arm. The input terminals 51 and 53 receive their voltage from the primary winding 61, and the output terminals are the midterminal 54 and ground. Since these are balanced with respect to the input, the frequency or frequencies of the input do not appear as such in the output.

The elimination of the two input frequencies from the output signal is perhaps more clearly demonstrated by mathematical analysis. The Fourier expansion of a rectangular carrier wave form such as either of those in Fig. 2A is:

$$\frac{4}{\pi}E_c\left[\sin\omega_c t+\frac{1}{3}\sin 3\omega_c t+\frac{1}{5}\sin 5\omega_c t+\ .\ .\ .\ \right] \quad (1)$$

in which $E_c$ is the maximum carrier voltage, $\omega_c$ is its frequency and $t$ is elapsed time. Let it be assumed for convenience that the modulation voltage is a single sinusoid, although a similar result is obtained with a modulation envelope of any form. The modulation voltage is:

$$E_m \sin \omega_m t \quad (2)$$

in which $E_m$ is the maximum modulation voltage and $\omega_m$ is the modulation frequency. It is obvious that the process that occurs in the coil 52 results in a voltage at the midterminal 54 representing the result of a multiplication of the applied modulation voltage by $+\frac{1}{2}$ and $-\frac{1}{2}$ in successive carrier half cycles, the full voltage between terminals 51 and 53 being considered the applied modulation voltage. This process is then represented by multiplying the sine wave by a square wave of unit amplitude, multiplied by the square wave maximum voltage and by $\frac{1}{2}$, resulting in:

$$\frac{2}{\pi}E_cE_m\left[\cos(\omega_c-\omega_m)t-\cos(\omega_c+\omega_m)t+\frac{1}{3}\cos(3\omega_c-\omega_m)t-\frac{1}{3}\cos(3\,\omega_c-\omega_m)t+\ .\ .\ .\ \right] \quad (3)$$

This expression, containing only sum and difference terms in $\omega_c$ and $\omega_m$, establishes that neither the carrier frequency nor the modulation frequency appear as a frequency component of the mixer-modulator output. In the case of a modulation input having any other cyclic form, it can be broken down to its harmonic content and the above reasoning applied to each frequency component separately.

What is claimed is:

1. A mixer-modulator for modulating a pair of input signals, and for producing a mixed output therefrom in which the input signal frequencies are suppressed comprising, a balanced impedance, means for impressing one of said input signals across said impedance, a first pair of unidirectionally conductive elements having one of their unlike poles connected together and to an end terminal of said impedance and their other unlike poles connected together through resistive means, a second pair of unidirectionally conductive elements having one of their unlike poles connected together and to the other end terminals of said impedance and their other unlike poles connected together through a second resistive means, an output circuit having one terminal connected to the electrical center of said impedance and its other terminal connected to the electrical centers of said first and second mentioned resistive means, and means for rendering said first pair of unidirectionally conductive elements conductive and inhibiting the conductivity of said second pair of unidirectionally conductive elements and alternately rendering said second pair of unidirectionally conductive elements conductive and inhibiting the conductivity of said first pair of unidirectionally conductive elements in timed relation to the alternations of said second input signal.

2. A mixer-modulator for modulating a pair of input signals and for producing a mixed output therefrom in which the input signal frequencies are suppressed comprising, a balanced impedance, means for impressing one of said input signals across said impedance, a first pair of unidirectionally conductive elements having one of their unlike poles connected together and to an end terminal of said impedance and their other unlike poles connected together through a first resistor, a second pair of unidirectionally conductive elements having one of their unlike poles connected together and to the other end terminal of said impedance and their other unlike poles connected together through a second resistor, an output circuit having one terminal connected to the electrical center of said impedance and its other terminal connected to the electrical centers of said first and second resistors, a first pair of condensers connected in series between one end terminal of said first and second resistors, a second pair of condensers connected in series between the other end terminals of said first and second resistors, means for applying a potential having the same phase as said second input signal to the common junction of one of said pairs of condensers, and means for applying a potential whose phase is opposite to that of said second input signal to the common junction of the other of said pairs of condensers.

3. A mixer-modulator for modulating a pair of input signals and for producing a mixed output therefrom in which the input signal frequencies are suppressed comprising, a balanced impedance, means for impressing one of said input signals across said impedance, a first pair of diodes having the anode of one diode connected to the cathode of the other diode and to an end terminal of said impedance and the cathode of said one diode connected to the anode of said other diode through a first resistor, a second pair of diodes having the anode of one diode connected to the cathode of the other diode and to the other end terminal of said impedance and the cathode of said one diode connected to the anode of said other diode through a second resistor, an output circuit having one terminal connected to the electrical center of said impedance and its other terminal connected to the electrical center of said first and second resistors, a first pair of condensers connected in series between the cathode of said one diode of said first pair and the anode of said other diode of said second pair, a second pair of condensers connected in series between the anode of said other diode of said first pair and the cathode of said one diode of said second pair, means for applying a potential having the same phase as said second input signal to the common junction of one of said pair of condensers, and means for applying a potential whose phase is opposite to that of said second input signal to the common junction of the other of said pair of condensers.

4. A mixer-modulator for modulating a pair of input signals and for producing a mixed output therefrom in which the input signal frequencies are suppressed comprising, a balanced impedance, means for impressing one of said input signals across said impedance, a first pair of diodes having the anode of one diode connected to the cathode of the other diode and to an end terminal of said impedance and the cathode of said one diode connected to the anode of said other diode through a first resistor, a second pair of diodes having the anode of one diode connected to the cathode of the other diode and to the other end terminal of said impedance and the cathode of said one diode connected to the anode of said other diode through a second resistor, an output circuit having one terminal connected to the electrical center of said impedance and its other terminal connected to the electrical centers of said first and second resistors, a first pair of condensers connected in series between the cathode of said one diode of first pair and the anode of said other diode of said second pair, a second pair of condensers connected in series between the anode of said other diode of said first pair and the cathode of said one diode of said second pair, a discharge tube having at least an anode, cathode and control electrode, a resistor connected in the cathode circuit thereof, a resistor connected in the anode circuit thereof, a circuit interconnecting the cathode of said discharge tube and the common junction of said first pair of condensers, a circuit interconnecting the anode of said discharge tube and the common junction of said second pair of condensers, and means for impressing said second input signal on the input of said discharge tube.

References Cited in the file of this patent

UNITED STATES PATENTS

| Number | Name | Date |
|---|---|---|
| 2,086,602 | Caruthers | July 13, 1937 |
| 2,373,569 | Kannenberg | Apr. 10, 1945 |
| 2,446,188 | Miller | Aug. 3, 1948 |
| 2,608,650 | Myers | Aug. 26, 1952 |